United States Patent
Lee

(10) Patent No.: US 6,737,980 B2
(45) Date of Patent: May 18, 2004

(54) APPARATUS FOR MONITORING SPEED AND OPERATING TIME OF WAFER LIFT OF SEMICONDUCTOR FABRICATING EQUIPMENT

(75) Inventor: In-Pyo Lee, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 148 days.

(21) Appl. No.: 10/147,824

(22) Filed: May 20, 2002

(65) Prior Publication Data

US 2002/0186001 A1 Dec. 12, 2002

(30) Foreign Application Priority Data

Jun. 12, 2001 (KR) ........................................ 2001-32697

(51) Int. Cl.[7] .............................................. G08B 21/00
(52) U.S. Cl. ........................ 340/673; 340/674; 187/390; 187/391; 414/222.01; 414/486; 414/546; 438/716

(58) Field of Search ................................. 340/673, 674, 340/675, 679, 648, 680; 73/862.393, 862.392, 862.391; 118/612, 729, 631, 681, 682; 187/291, 293, 286, 390, 391; 414/222.01, 486, 546, 749.1, 785, 757; 438/14, 460, 716

(56) References Cited

U.S. PATENT DOCUMENTS

| | | | |
|---|---|---|---|
| 4,859,993 A | * | 8/1989 | Kagami et al. ............. 340/674 |
| 5,206,627 A | * | 4/1993 | Kato .......................... 340/674 |
| 5,900,062 A | * | 5/1999 | Loewenhardt et al. .. 118/723 R |
| 6,485,248 B1 | * | 11/2002 | Taylor, Jr. ................... 414/672 |

* cited by examiner

Primary Examiner—Davetta W. Goins
(74) Attorney, Agent, or Firm—Volentine Francos, PLLC

(57) ABSTRACT

An apparatus that automatically monitors speed and operating time of a semiconductor fabricating equipment lift that lifts a wafer cassette up/down. The apparatus automatically indicates operational state of the lift including lift speed time, use time after motor replacement and overhaul, and number of wafers processed, for confirmation by a worker.

15 Claims, 5 Drawing Sheets

APPARATUS FOR MONITORING SPEED AND OPERATING TIME OF WAFER LIFT OF SEMICONDUCTOR FABRICATING EQUIPMENT

The present application claims priority under 35 U.S.C. § 119 to Korean Application No. 2001-0032697 filed on Jun. 12, 2001, which is hereby incorporated by reference in its entirety for all purposes.

BACKGROUND OF THE INVENTION

1. Field of the Invention

The present invention relates to an apparatus for monitoring speed and operating time of a wafer lift of semiconductor fabricating equipment, and more particularly to an apparatus for monitoring speed and operating time of a wafer lift of semiconductor fabricating equipment that lifts wafers up/down.

2. Description of the Related Art

In general, a wafer handler of semiconductor fabricating equipment has a wafer cassette at a lift platform that is to be lifted up/down by a lift shaft. In order to monitor the operating speed of a wafer lift, an oscilloscope 12 is connected to a wafer lift interface circuit 10, as shown in FIG. 1, so that the lift up/down speed time waveform shown in FIG. 2 may be checked. A lift up/down speed time waveform is adjusted to be 650–750 msec by using a variable resistor mounted at a lift interface circuit 10, if it is discriminated and confirmed that the lift up/down speed time waveform does not fall within a range of 650–750 msec.

In a conventional apparatus for checking the speed of a wafer lift, a waveform is maintained and measured as a cycle of only 0.3 seconds on the screen, due to impossibility of instant waveform capture of the oscilloscope. As such, there has been a variation in the wafer lift speed due to calibration error, which has negative influence on wafer handling.

Also, there are problems with the conventional method for measuring the lift up/down speed time, because using the oscilloscope requires a complicated procedure performed by a skilled engineer to accurately adjust the cycle. The measurement procedure takes a long time to perform, which deteriorates productivity. Furthermore, there is another problem with the conventional method in that overhaul or motor replacement of the wafer handler is required on designated days, which is inefficient from the standpoint of cost and labor.

SUMMARY OF THE INVENTION

The present invention is therefore directed to a wafer lift speed monitoring apparatus of semiconductor fabricating equipment which substantially overcomes one or more of the problems due to the limitations and disadvantages of the related art.

It is therefore an object of the present invention to provide a wafer lift speed monitoring apparatus of semiconductor fabricating equipment which automatically measures and indicates the speed of a wafer lift.

It is another object of the present invention to provide a wafer lift use time monitoring apparatus of semiconductor fabricating equipment that automatically indicates a period of time to use a wafer lift.

It is still another object of the present invention to provide a wafer lift operational state monitoring apparatus of semiconductor fabricating equipment that accurately checks the use time of a wafer lift after overhaul, so that efficient cost and labor effectiveness may be maintained without performing an overhaul or motor replacement on designated days.

In order to accomplish the aforementioned objects of the present invention, there is provided a wafer lift speed monitoring apparatus of semiconductor fabricating equipment including a lift interface circuit that transmits a motor driving signal; a signal interface that receives the motor driving signal output from a motor driving command output terminal of the lift interface circuit and outputs a shaped waveform signal responsive thereto; a high frequency oscillator that generates a high frequency signal; a division circuit that divides the high frequency signal into a divided frequency signal; a cycle sampling unit that samples the shaped waveform signal by a cycle unit of the divided frequency signal to estimate a time value of the shaped waveform signal; a memory that stores a reference lift speed time value; a display unit; and a controller that controls display of a lift up/down speed time value by the display unit based on the time value output from the cycle sampling unit and outputs a warning signal if the lift up/down speed time value as compared with the reference lift speed time value stored in the memory are confirmed not to correspond.

In order to accomplish the aforementioned objects of the present invention, there is also provided an apparatus for monitoring use time after overhaul of a lift of semiconductor fabricating equipment including a lift interface circuit having a variable resistor that transmits a motor driving signal to control the lift and a lift up/down speed time of the lift; a signal interface that receives the motor driving signal output from a motor driving command output terminal of the lift interface circuit and that outputs a shaped waveform signal responsive thereto; a time measurement reference circuit that periodically checks the shaped waveform signal, provides a counting termination signal if the shaped waveform signal is not detected, and provides a counting initiation signal if the shaped waveform signal is detected; a timer that counts use days and time after overhaul responsive to a predetermined control signal; a display unit; and a controller that controls the timer based on the counting initiation signal and that counting termination signal, and that controls display of the values of the counted use days and time after overhaul on the display unit.

In order to accomplish the aforementioned objects of the present invention, there is further provided a wafer number monitoring apparatus for a lift of semiconductor fabricating equipment including a lift interface circuit having a variable resistor that transmits a motor driving signal to control the lift and a lift up/down speed time of the lift; a signal interface that receives the motor driving signal output from a motor driving command output terminal of the lift interface circuit and that outputs a shaped waveform signal responsive thereto; a counting pulse generator that periodically checks the shaped waveform signal and that generates counting pulses at an interval of unit time responsive thereto; a counter that counts the counting pulses to provide a counted value; a display unit; and a controller that controls display of a number of wafers processed on the display unit responsive to the counted value.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
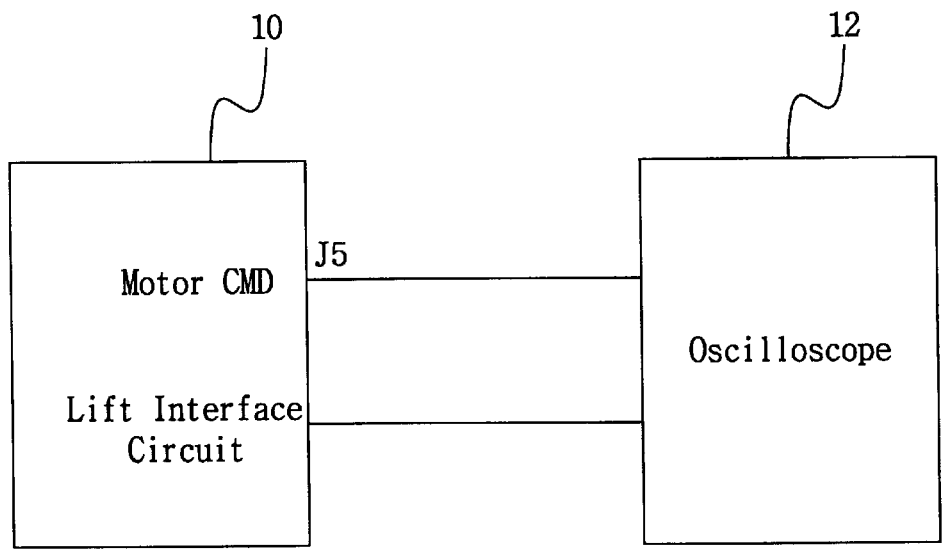
FIG. 1 is a structural view of a conventional apparatus for checking speed of a lift.
Figure 2:
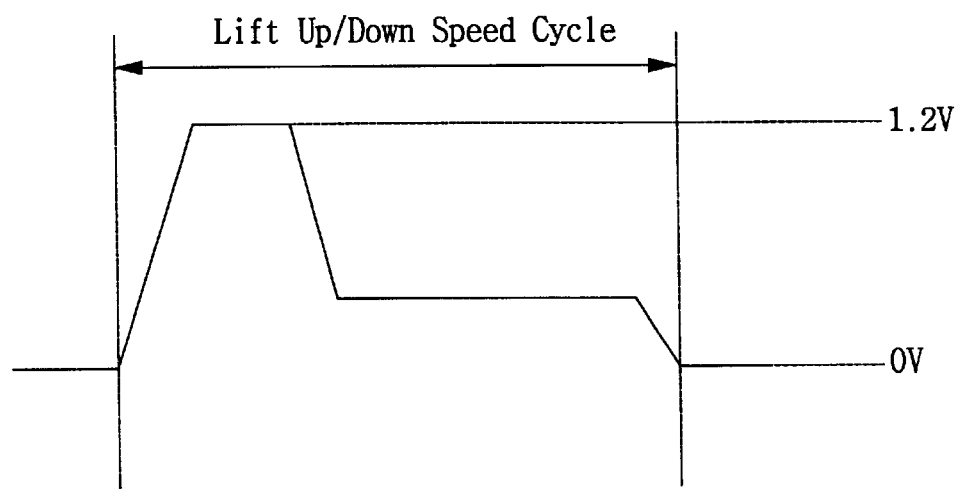
FIG. 2 is a reference waveform view of lift up/down speed time.
Figure 3:
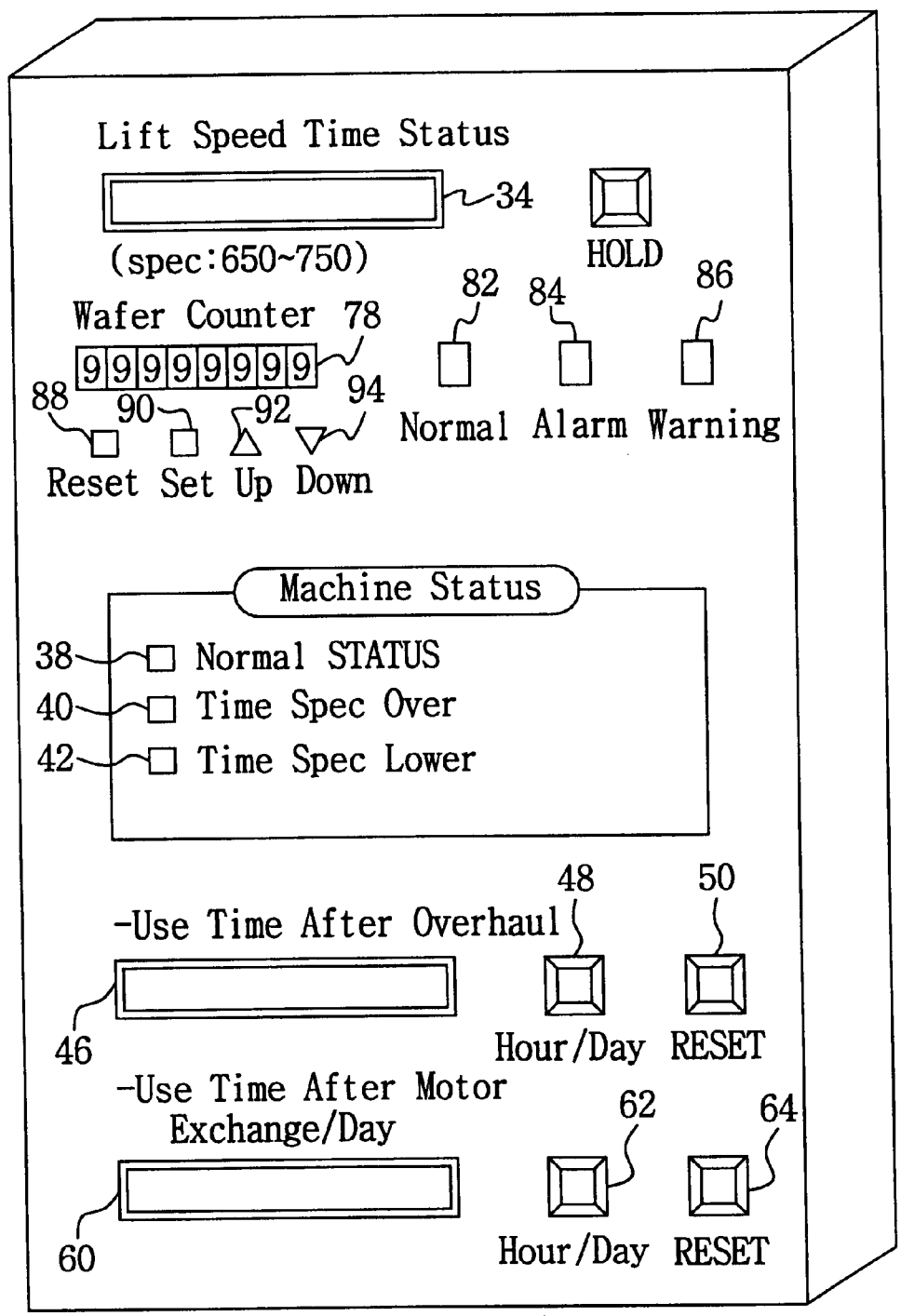
FIG. 3 is a structural view of a lift operational state indicating apparatus in accordance with an embodiment of the present invention.

FIG. 3 is a structural view illustrating an appearance of a lift operational state indicating apparatus in accordance with an embodiment of the present invention. The lift operational state indicating apparatus shown in FIG. 3 includes a lift speed cycle status displaying unit 34; a wafer count number displaying unit 78; an LED 82 that displays a normal status of the wafer count number; an LED 84 that displays an alarming status if the wafer count number exceeds a predetermined value; an LED 86 that displays a warning status if the wafer count number exceeds a predetermined value; a reset key 88 that resets the wafer count number; a set key 90 that sets the wafer count number for alarm or warning; an up key 92 that increases the wafer count number; a down key 94 that decreases the wafer count number; a blue LED 38 that indicates a normal status of a lift speed cycle; a red LED 40 that indicates a longer status of a lift speed cycle; a yellow LED 42 that indicates a shorter status of a lift speed cycle; a use time after overhaul displaying unit 46; a time/days selection button 48 that selects use time after overhaul or use days after overhaul; a reset key 50 that resets a use time after overhaul; a motor drive time display window 60 that displays drive time of a motor after replacement; a time/days selection button 62 that selects motor drive time or days, and a reset key 64 that resets motor drive time. It is noted that LEDs 38, 40 and 42 are not necessarily limited as blue, red and yellow respectively, but can be any other colors.

Figure 4:
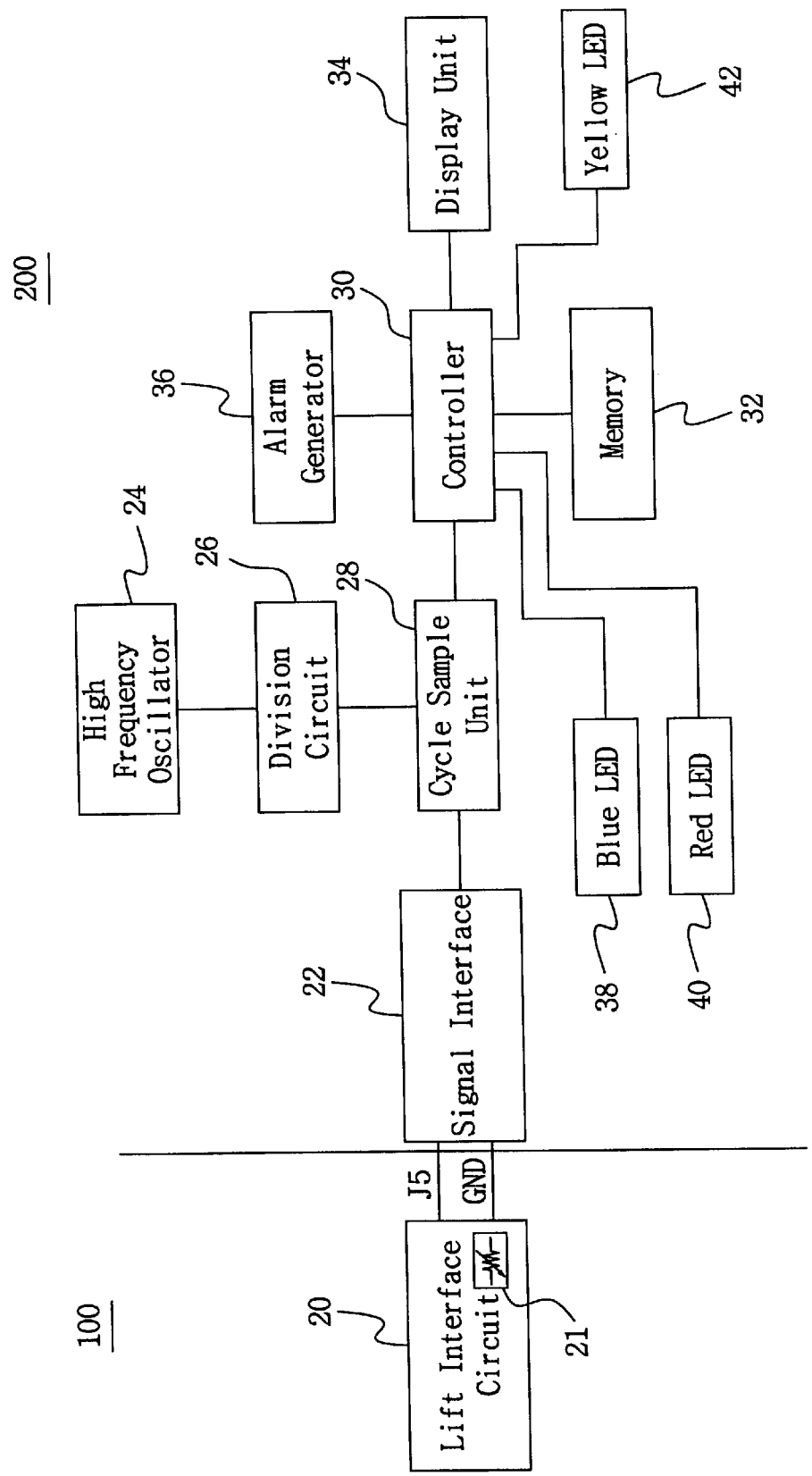
FIG. 4 is a structural diagram of an apparatus for monitoring speed of a lift in accordance with an embodiment of the present invention.

FIG. 4 is a structural diagram of an apparatus for monitoring speed of a lift in accordance with an embodiment of the present invention. As shown in FIG. 4, the apparatus includes a lift controller 100 and a motor driving unit 200. As illustrated, lift controller 100 includes a lift interface circuit 20 having a variable resistor 21, that transmits a motor driving signal from lift controller 100 to motor driving unit 200 to control the lift and a lift up/down speed of the lift.

As further illustrated in FIG. 4, motor driving unit 200 includes a signal interface 22 that receives the motor driving signal via motor driving command output terminal (J5) of lift interface circuit 20, shapes the waveform of the motor driving signal to remove noise and/or amplify the motor driving signal for example, and outputs a shaped waveform signal responsive thereto. A high frequency oscillator 24 generates a high frequency signal that is provided to division circuit 26, which divides the oscillating frequency signal generated by high frequency oscillator 24 into a divided frequency signal. Cycle sampling unit 28 samples the shaped waveform signal provided by signal interface 22 by a cycle unit of the divided frequency signal provided by division circuit 26, and estimates a time value of the shaped motor driving signal. Memory 32 stores a reference lift speed time value. Controller 30 controls and displays a lift up/down speed time value on display unit 34, based on reception of the time value output from cycle sample unit 34, and at the same time outputs a warning signal if the lift up/down time value as compared with the reference lift speed time value stored in memory 32 is confirmed not to correspond to the reference lift speed time value. Alarm generator 36 generates an alarm under control of controller 30. Blue LED 38 indicates a normal status of the lift speed cycle, red LED 40 indicates a longer status of the lift speed cycle, and yellow LED 42 indicates a shorter status of the lift speed cycle, under control of controller 30.

In greater detail, controller 30 turns on blue LED 38 (also shown in FIG. 3) to indicate a normal status of the lift speed cycle if the lift up/down speed time is within or corresponds to the stored reference lift speed time value (for instance, 650–750 msec). On the other hand, controller 30 turns on red LED 40 (also shown in FIG. 3) to indicate a shorter status of the lift speed cycle if the lift up/down speed time is less than the stored reference lift speed time value. Controller 30 turns on yellow LED 42 (also shown in FIG. 3) to indicate a longer status of the lift speed cycle if the lift up/down speed cycle is greater than the stored reference lift speed time value. The display unit 34 displays the time value output from controller 30. Also, controller 30 controls alarm generator 36 to generate an alarm if the lift up/down speed of the lift speed cycle is less than or greater than the stored reference lift speed time value. Accordingly, the undesirable occurrence of changes in lift speed are automatically determined in accordance with the first embodiment, and corresponding display and alarm responsive to such an occurrence are provided in a manner easily recognizable.

Figure 5:
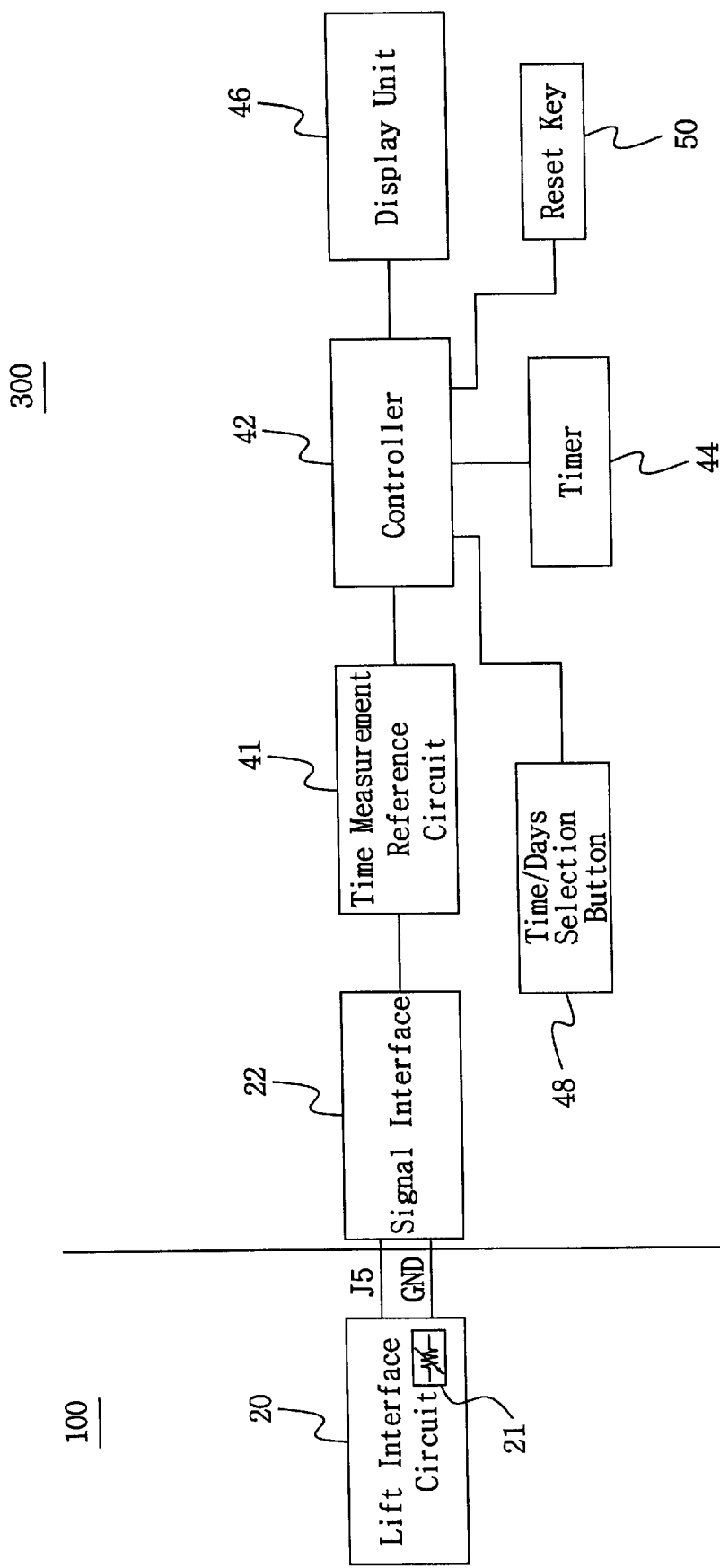
FIG. 5 is a structural diagram of an apparatus for monitoring use time after overhaul in accordance with an embodiment of the present invention.

FIG. 5 is a structural diagram of an apparatus for monitoring a use time after overhaul in accordance with a further embodiment of the present invention. As shown in FIG. 5, the apparatus includes a lift controller 100 and a motor driving unit 300. As illustrated, lift controller 100 includes a lift interface circuit 20 having a variable resistor 21, that transmits a motor driving signal from lift controller 100 to motor driving unit 300 to control the lift and a lift up/down speed of the lift.

As further illustrated in FIG. 5, motor driving unit 300 includes a signal interface 22 that receives the motor driving signal via motor driving command output terminal (J5) of lift interface circuit 20, shapes the waveform of the motor driving signal and outputs a shaped wafer signal responsive thereto. Time measurement reference circuit 41 periodically checks the shaped waveform signal provided by signal interface 22 to output a counting termination signal if the shaped motor driving signal is not detected, and to output a counting initiation signal if the shaped motor driving signal is detected. Timer 44 counts use days and time after overhaul in response to a control signal provided from controller 42. That is, controller 42 controls the timer 44 based on the counting initiation signal and the counting termination signal output from time measurement reference circuit 41, and also controls display of the values of counted use days and time after overhaul on a display unit 46. Time/days selection button 48 is provided for selection of use time or use days after overhaul. Reset key 50 is provided for resetting a use time after overhaul.

In an alternative embodiment, operation to display the use days and time after replacement of motors on display unit 60 of FIG. 3, can also be made by the same displaying process as shown in and described with respect to FIG. 5. Accordingly, in accordance with these embodiments of the invention, automatic display of use time or use days after overhaul or replacement of the lift motor is provided, so that the operating condition of the lift motor can be easily recognized and monitored.

Figure 6:
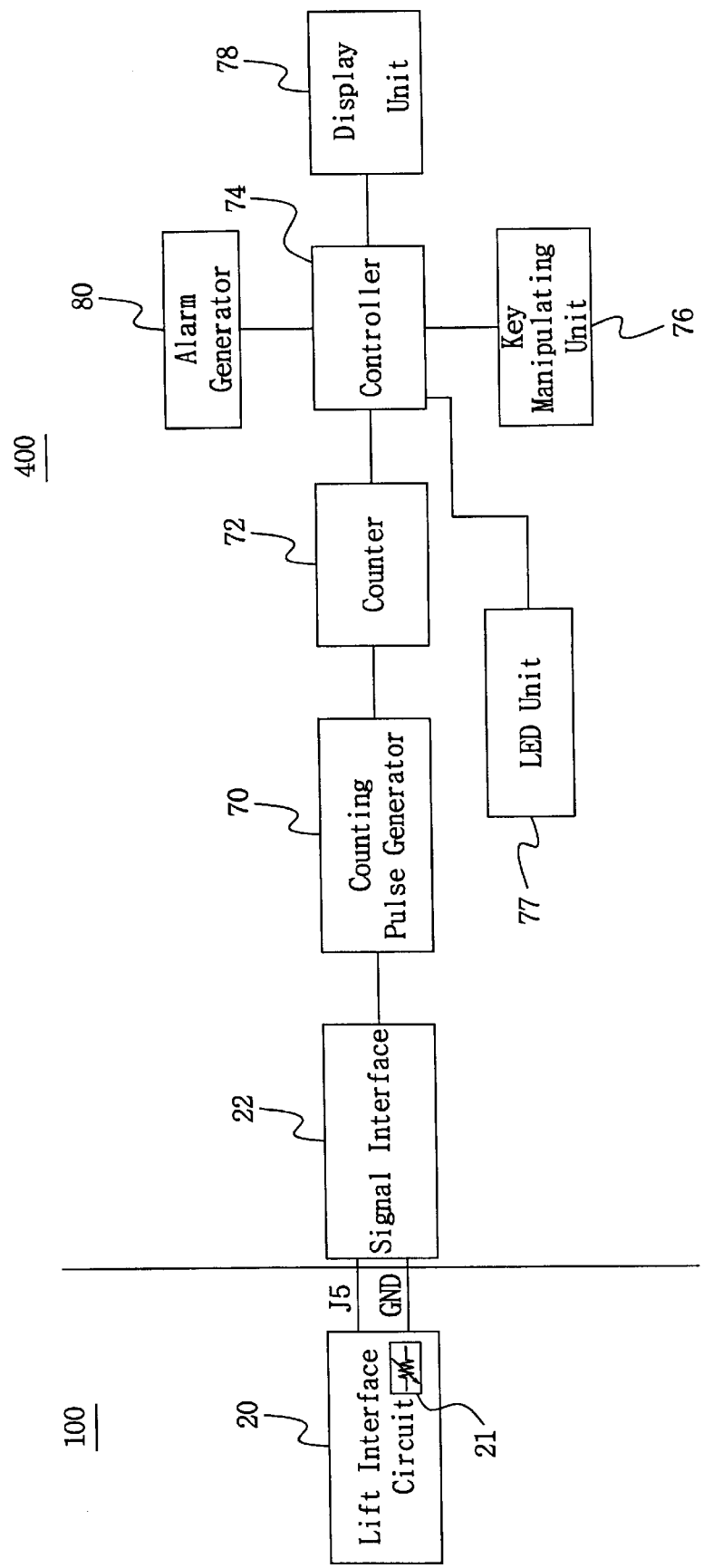
FIG. 6 is a structural diagram of an apparatus for monitoring the number of wafers processed in accordance with an embodiment of the present invention.

FIG. 6 is a structural diagram of an apparatus for monitoring the number of wafers processed in accordance with a still further embodiment of the present invention. As shown in FIG. 6, the apparatus includes a lift controller 100 and a motor driving unit 400. As illustrated, lift controller 100 includes a lift interface circuit 20 having a variable resistor 21, that transmits a motor driving signal from lift controller 100 to motor driving unit 400 to control the lift and a lift up/down speed of the lift.

As further illustrated in FIG. 6, motor driving unit 400 includes a signal interface 22 that receives the motor driving signal via motor driving command output terminal (J5) of lift interface circuit 20, shapes the waveform of the motor driving signal and outputs a shaped waveform signal responsive thereto. Counting pulse generator 70 periodically checks the shaped waveform signal provided by signal interface 22, to generate counting pulses at an interval of unit time. Counter 72 counts up based on the pulses generated from counting pulse generator 70 to provide a counted value. Key manipulating unit 76 includes a reset key 88 for resetting the wafer count number, a set key 90 for setting the wafer count number for alarm or warning, an up key 92 for increasing the wafer count number and a down key 94 for decreasing the wafer count number. Keys 88, 90, 92 and 94 of key manipulating unit 76 are also shown in FIG. 3. Controller 74 controls display unit 78 to indicate the number of wafers processed based on the counted value provided from counter 72. That is, the number of counted pulses provided by counter 72 has a ratio relationship with respect to the number of wafers counted, so that a wafer count may be determined by controller 74 responsive to the counted pulses in view of the ratio relationship. Controller 74 provides further control to increase the wafer count value as the up key 92 of the key manipulating unit 76 is pressed, to decrease the wafer count value as the down key 94 is pressed, and to store the wafer count value as a reference number of wafers in a memory of controller 74 if set key 90 is pressed. As noted above, display unit 78 displays the number of wafers processed by the lift under control of controller 74. LED unit 77 includes a blue LED 38 for indicating a normal status of a lift speed cycle, a red LED 40 for indicating a longer status of a lift speed cycle and a yellow LED 42 for indicating a shorter status of a lift speed cycle. The LEDs 38, 40 and 42 of LED unit 77 are shown in FIG. 3.

In greater detail, controller 74 controls and stores the reference number of wafers input to set a first reference number of wafers and a second reference number of wafers, if a set key 90 is input after the up or down keys 92 or 94 are manipulated to input the first and second reference numbers of wafers. The first reference number of wafers is set at 1% over the number of wafers to be processed after overhaul or motor replacement at the lift, and the second reference number of wafers is set at 2% over the number of wafers to be processed after overhaul or motor replacement at the lift.

Controller 74 also controls alarm generator 80 to generate an alarm and LED 84 to simultaneously turn on, if the number of wafers is greater than the first reference number of wafers set and stored in the internal memory of controller 74. Controller 74 also turns on LED 86 if the number of wafers is greater than the second reference number of wafers set and stored in the internal memory of controller 74. LEDs 84 and 86 may be red and yellow respectively, although not necessarily limited to these particular colors.

In accordance with the above described preferred embodiments, there is an advantage in that the operational states of a lift that moves a cassette having wafers up/down, that is the lift speed cycle and the use time after motor replacement and overhaul, are automatically displayed for confirmation by a worker. Thus, even an unskilled worker can easily observe a change in operation of the lift at any time, to prevent loss of wafers.

In addition, another advantage of the preferred embodiments is that the use time of the lift is preset to avoid overhaul or motor replacement on designated dates. Thus, even if the time necessary for overhaul or motor replacement may be short, unnecessary waste of cost or labor force can be prevented by avoiding corresponding down time on designated dates or times.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A wafer lift speed monitoring apparatus of semiconductor fabricating equipment, comprising:
   a lift interface circuit that transmits a motor driving signal;
   a signal interface that receives the motor driving signal output from a command output terminal of the lift interface circuit and outputs a shaped waveform signal responsive thereto;
   a high frequency oscillator that generates a high frequency signal;
   a division circuit that divides the high frequency signal into a divided frequency signal;
   a cycle sampling unit that samples the shaped waveform signal by a cycle unit of the divided frequency signal to estimate a time value of the shaped waveform signal;
   a memory that stores a reference lift speed time value;
   a display unit; and
   a controller that controls display of a lift up/down speed time value by the display unit based on the time value output from the cycle sampling unit and outputs a warning signal if the lift up/down speed time value as compared with the reference lift speed time value stored in the memory are confirmed not to correspond.

2. The wafer lift speed monitoring apparatus of claim 1, further comprising a first LED that indicates a normal status of a lift speed cycle, a second LED that indicates a longer status of a lift speed cycle, and a third LED that indicates a shorter status of a lift speed cycle, under control of the controller based on the time value.

3. The wafer lift speed monitoring apparatus of claim 2, wherein the first, second and third LEDs have different respective colors.

4. The wafer lift speed monitoring apparatus of claim 1, further comprising an alarm generating unit that generates an alarm responsive to the warning signal output by the controller.

5. The wafer lift speed monitoring apparatus of claim 1, wherein the lift up/down speed time value is displayed on the display unit as a numerical value.

6. The wafer lift speed monitoring apparatus of claim 1, wherein the signal interface, the high frequency oscillator, the division circuit, the cycle sampling unit, the memory, the display unit and the controller comprise a motor driving unit, and the lift interface circuit is part of a lift controller.

7. An apparatus that monitors a use-time-after-overhaul of a lift of semiconductor fabricating equipment, comprising:
- a lift interface circuit having a variable resistor that transmits a motor driving signal to control the lift and a lift up/down speed time of the lift;
- a signal interface that receives the motor driving signal output from a motor driving command output terminal of the lift interface circuit and that outputs a shaped waveform signal responsive thereto;
- a time measurement reference circuit that periodically checks the shaped waveform signal, provides a counting termination signal if the shaped waveform signal is not detected, and provides a counting initiation signal if the shaped waveform signal is detected;
- a timer that counts use days and time after overhaul;
- a display unit; and
- a controller that controls the timer based on the counting initiation signal and the counting termination signal, and controls display of values of the counted use days and time after overhaul on the display unit.

8. The apparatus of claim 7, further comprising a time/days selection button that provides selection of the use time or days after overhaul of the lift.

9. The apparatus of claim 7, further comprising a reset key that provides a selection of resetting the timer.

10. The apparatus of claim 7, wherein the signal interface, the time measurement reference circuit, the timer, the display unit and the controller comprise a motor driving unit, and the lift interface circuit is part of a lift controller.

11. A wafer number monitoring apparatus for a lift of semiconductor fabricating equipment, comprising:
- a lift interface circuit having a variable resistor that transmits a motor driving signal to control the lift and a lift up/down speed time of the lift;
- a signal interface that receives the motor driving signal output from a motor driving command output terminal of the lift interface circuit and that outputs a shaped waveform signal responsive thereto;
- a counting pulse generator that periodically checks the shaped waveform signal and that generates counting pulses at an interval of unit time responsive thereto;
- a counter that counts the counting pulses to provide a counted value;
- a display unit; and
- a controller that controls display of a number of wafers processed on the display unit, responsive to the counted value.

12. The wafer number monitoring apparatus of claim 11, further comprising:
- a memory that stores a reference number value of wafers; and
- an alarm generator that provides an alarm when the controller determines that the number of wafers processed exceeds the reference number value of wafers.

13. The wafer number monitoring apparatus of claim 12, further comprising a key manipulating unit that provides selection of the reference number of wafers.

14. The wafer number monitoring apparatus of claim 12, further comprising an LED that provides indication that the number of wafers processed exceeds the reference number value of wafers, under control of the controller.

15. The wafer number monitoring apparatus of claim 11, wherein the signal interface, the counting pulse generator, the counter, the display unit and the controller comprise a motor driving unit, and the lift interface circuit is part of a lift controller.

\* \* \* \* \*